United States Patent [19]
Shaw

[11] 4,329,656
[45] May 11, 1982

[54] HIGH-SPEED VOLTAGE SUBTRACTOR

[75] Inventor: Pern Shaw, Austin, Tex.

[73] Assignee: Motorola, Inc., Schaumburg, Ill.

[21] Appl. No.: 82,458

[22] Filed: Oct. 9, 1979

Related U.S. Application Data

[60] Division of Ser. No. 953,307, Oct. 20, 1978, abandoned, which is a continuation of Ser. No. 764,499, Jan. 31, 1977, abandoned.

[51] Int. Cl.³ .............................................. H03F 3/45
[52] U.S. Cl. ...................................... 330/257; 330/260
[58] Field of Search .................. 330/69, 110, 257, 260

[56] References Cited
U.S. PATENT DOCUMENTS
4,053,846  10/1977  Acker .................................... 330/110

*Primary Examiner*—James B. Mullins
*Attorney, Agent, or Firm*—Joe E. Barbee

[57] ABSTRACT

A subtractor for use in a digital to digital converter has fast response and uses an operational amplifier. The fast response is achieved by varying current flow in associated circuits. An analog input controls current flow through a first portion of the circuitry and a voltage reference controls current flow through a second portion of the circuit. The total current flow through the first and second portions of the circuit is provided by a current source. The analog input is coupled to a first input of the operational amplifier and the voltage reference is coupled to a second input of the operational amplifier. A first logarithmic impedance is coupled between the first input of the operational amplifier and the output of the operational amplifier. A second logarithmic impedance is coupled between the second input of the operational amplifier and a bias voltage. The bias voltage is used to provide a predetermined biased voltage at the output of the operational amplifier.

4 Claims, 10 Drawing Figures

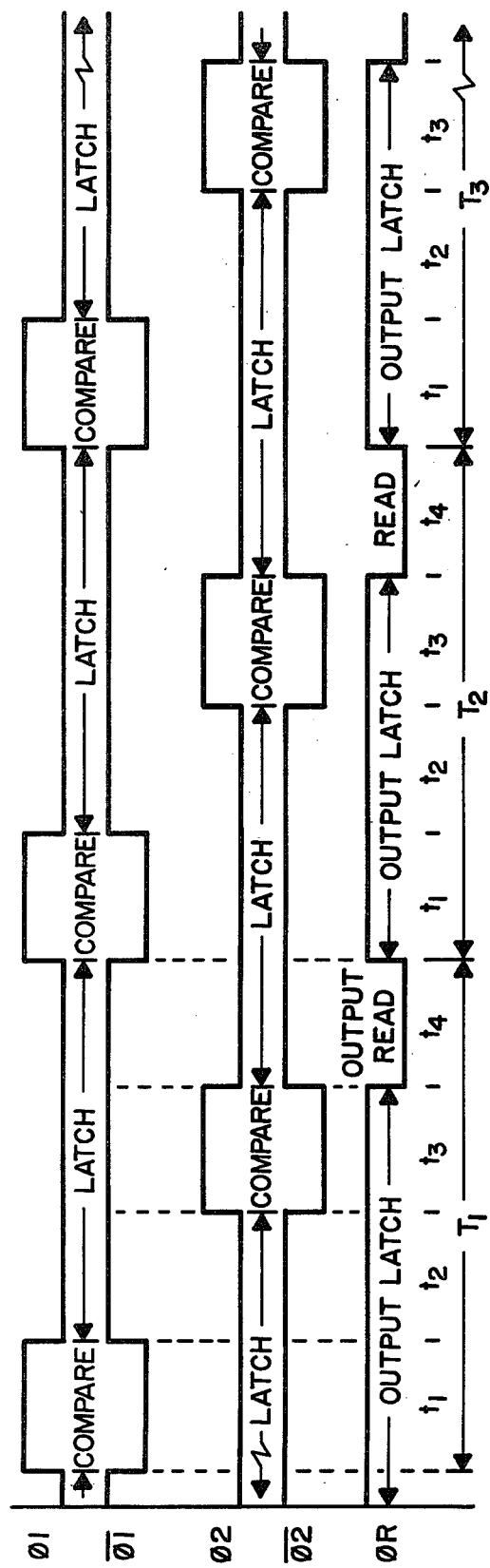
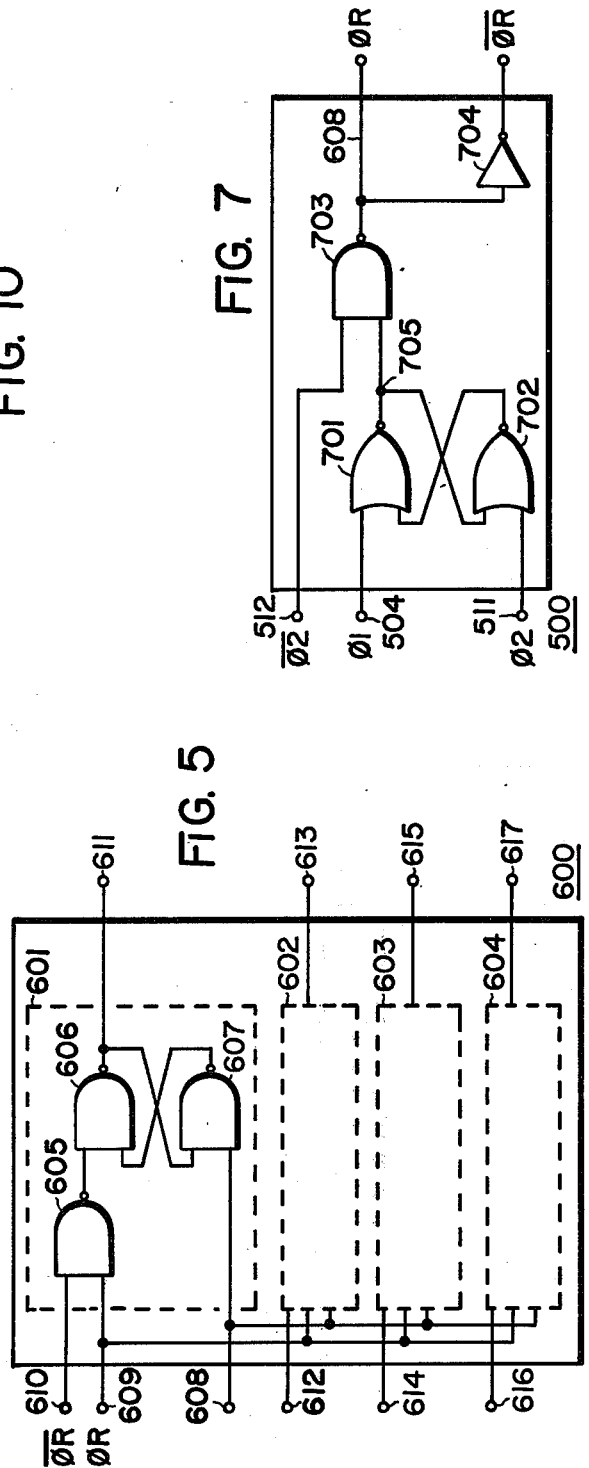
FIG. 10
FIG. 7
FIG. 5

HIGH-SPEED VOLTAGE SUBTRACTOR

This is a division of application Ser. No. 953,307, filed Oct. 20, 1978 and now abandoned, which is a continuation of application Ser. No. 764,499, filed on Jan. 31, 1977, and now abandoned.

BACKGROUND

The present invention relates, in general, to a subtractor circuit and more particularly, to a high-speed voltage subtractor useful in an analog-to-digital converter.

Voltage substractors are useful in electronic circuits and particularly in analog-to-digital converters. In an analog to digital converter it is generally only necessary to determine the difference between two voltages which are somewhat close in magnitude to each other. It is much faster to switch current in a circuit than it is to switch voltage since most of the time capacitors or even parasitic capacitance will tend to slow down voltage switching. One such subtractor circuit is disclosed in U.S. Pat. No. 4,124,824 which issued Nov. 7, 1978 to Kreinick et al. It has been found that the voltage subtractor of the aforementioned patent can be simplified by the use of a precision high-speed operational amplifier.

Accordingly, it is an object of the present invention to provide a high-speed voltage subtractor which uses an operational amplifier.

Another object of the present invention is to provide a high-speed voltage subtractor having an operational amplifier and which uses current switching as opposed to voltage switching.

SUMMARY OF THE INVENTION

In carrying out the above and other objects, there is provided in one form thereof a subtractor circuit having an operational amplifier and a current source. The operational amplifier has a first input coupled to an analog input which receives the unknown voltage, and a second input which is coupled to a voltage reference. The first input also has an impedance means coupled from the first input to the output of the operational amplifier. A second impedance is coupled between the second input of the operational amplifier and a bias reference voltage. The bias reference voltage is used to preset an output voltage level at the output of the operational amplifier. The analog input and the reference input are both coupled to the current source. Variations at the analog input can cause the current flow through the first impedance to vary.

BRIEF DESCRIPTION OF THE DRAWINGS

FIG. 5 is a logic diagram of output latches which can be utilized in the embodiment of FIG. 1.

FIG. 7 is logic diagram of the read-latch command generator of FIG. 1.

FIG. 10 is a timing diagram which is useful in describing the operation of the invention.

DESCRIPTION OF THE INVENTION

Figure 1:
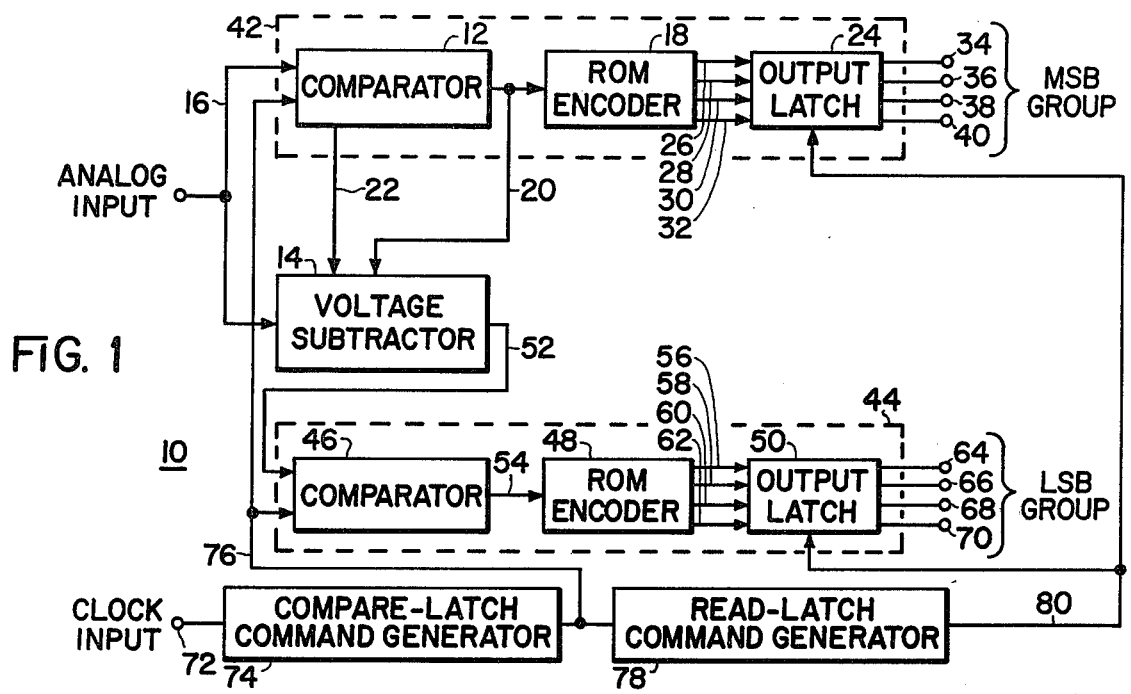
FIG. 1 is a block diagram of an analog-to-digital converter according to the invention.

FIG. 1 shows a serial-parallel A/D converter 10 according to the present invention. FIG. 1 is a functional block diagram and, as such, a single line interconnecting functional block may represent a single conductor or a multiplicity of conductors as will be made clear by the subsequent detailed description. Power supply and reference voltage connections are also omitted from FIG. 1 in the interest of simplicity.

In FIG. 1, an analog input couples to a first comparator 12 and a voltage subtractor 14 via conductor 16. The output of comparator 12 couples to ROM encoder 18 and to voltage subtractor 14 via line 20, which represents a multiplicity of conductors. Reference voltage levels generated within comparator 12 are coupled to voltage subtractor 14 via line 22 which also represents a multiplicity of conductors. ROM encoder 18 couples to output latch 24 via conductors 26, 28, 30 and 32. Output latch 24 produces a digital output representation on conductors 34, 36, 38 and 40 which form the most significant bit group output of the first parallel A/D converter means 42 formed by comparator 12, ROM encoder 18 and output latch 24. A second parallel analog-to-digital converter means 44 is formed by comparator 46, ROM encoder 48 and output latch 50. conductor 52 couples the analog difference output signal of voltage subtractor 14 to an input of comparator 46. Line 54, which represents a multiplicity of conductors, couples the output of comparator 46 to the input of ROM encoder 48. Conductors 56, 58, 60, and 62 couple the outputs of ROM encoder 48 to the inputs of output latch 50. The outputs of output latch 50 are coupled to conductors 64, 66, 68 and 70 to form the least significant bit group output of analog-to-digital converter circuit 10. Conductor 72 couples a clock input to a compare-latch command generator 74 and line 76, which represents a multiplicity of conductors, couples the output of compare-latch command generator 74 to the input of first comparator 12, the input of second comparator 46 and the input of read-latch command generator 78. Line 80, which represents a multiplicity of conductors, couples the output of read-latch command generator 78 to the inputs of output latch 24 and output latch 50.

The mode of operation of analog-to-digital converter circuit 10 is particularly adapted for high-speed operation. As the subsequent detailed descriptions will illustrate, the circuit configuration of each function block is adapted for high speed. In addition, and more significantly, the particular arrangement of functional elements as illustrated in FIG. 1 provides unique advantages for achieving high-speed operation. These advantages derive from the fact that the particular structures and interconnections used in FIG. 1 allows a time overlap or coincidence of the parallel conversion of the least significant bit group output and the most significant bit group digital output.

Figure 2:
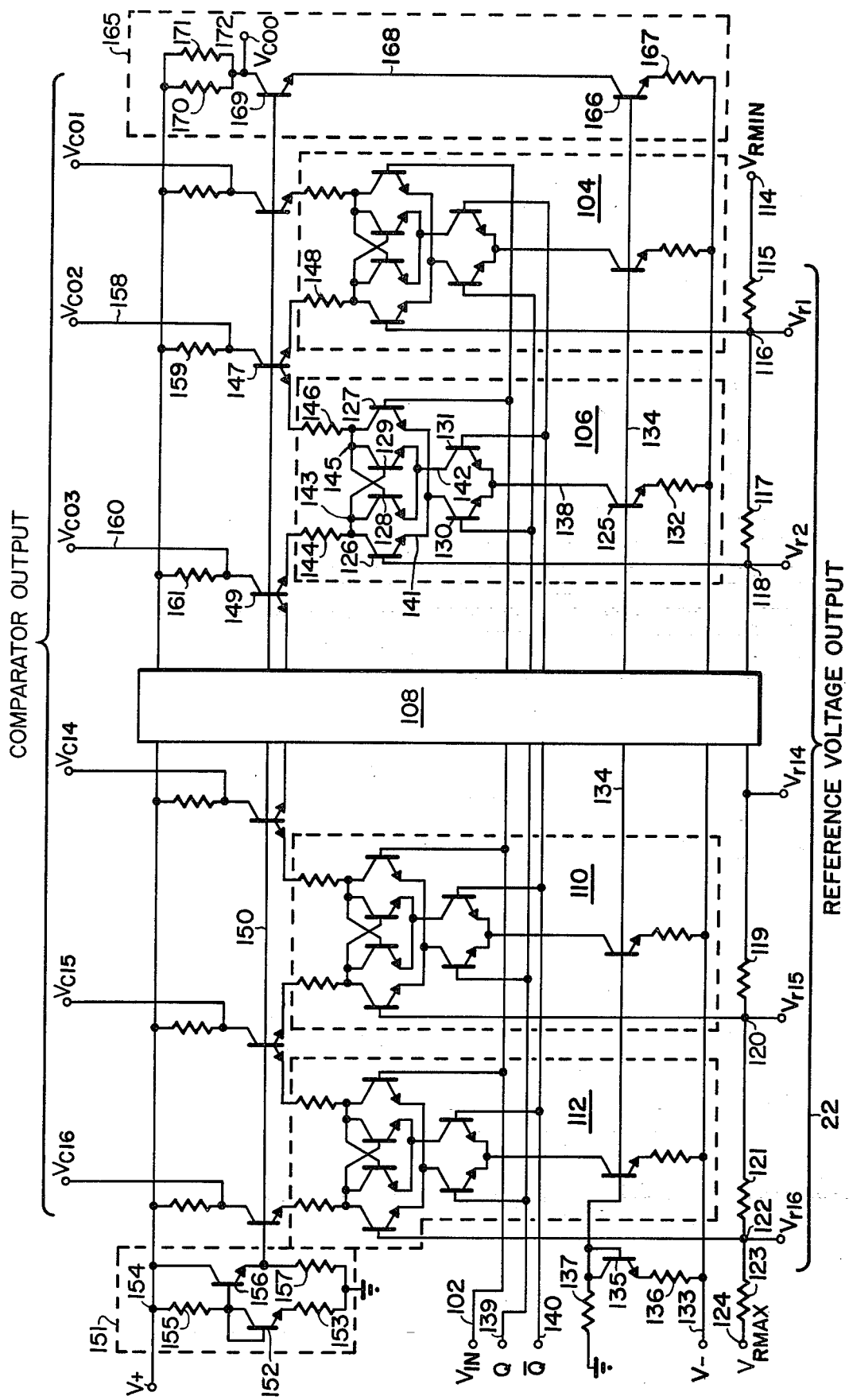
FIG. 2 is a schematic circuit diagram of a comparator which can be used to provide both comparators shown in the embodiment of FIG. 1.

FIG. 2 shows one particular embodiment of a high-speed comparator circuit which can be used as comparators 12 and 46 in the A/D converter circuit of FIG. 1. The basic function of the comparator circuit of FIG. 2 is to compare the kind of applied analog input voltage to a series of voltage reference values to produce a digital output. For the particular embodiment of FIG. 2, this is accomplished using fifteen comparator circuits. Each of the comparator circuits contains identical circuitry and, for simplicity in the drawing, FIG. 2 shows the detailed circuit structure and interconnections of only four of these comparator circuits which are, accordingly, representative of the others. Thus, as shown, the applied analog input signal couples via conductor 102 to a first comparator stage 104, a second comparator stage 106 and additional 11 comparator stages which are part of block 108 but not shown specifically, a fourteenth comparator stage 110 and a fifteenth comparator stage 112. The reference voltage values for each comparator stage are generated by a series connected resistive ladder. This ladder is formed by a first terminal 114 which couples to resistor 115 which couples to terminal 116 which in turn couples to resistor 117 which couples to terminal 118, etc. This series interconnection continues for eleven additional resistors which are included in block 108 but not shown and then continues with a connection to resistor 119 which couples to terminal 120 which in turn couples to resistor 121 which couples to node 122 which couples to resistor 123 which couples to terminal 124. Thus, the connection of a minimum reference voltage value to terminal 114 and a maximum voltage reference value to terminal 124 produces a series of reference voltage values between the minimum and the maximum at each of the recited nodes. The operation of comparator circuit 100 will now be explained in terms of the operation of individual comparator stage 106. Comparator stage 106 comprises a constant current source transistor 125, a pair of common emitter input transistors 126 and 127, a pair of regenerative latching transistors 128 and 129 and a pair of compare-latch mode selection transistors 130 and 131. The emitter of current source transistor 125 couples to resistor 132 which in turn couples to a power supply conductor 133 which couples to the V− power supply. The base of constant current source transistor 125 connects to conductor 134 which couples in common to the bases of each of the constant current source transistors in each of the other comparator stages. Conductor 134 also couples to the base and the collector of transistor 135, which establishes the required operating reference current level for each of the constant current source transistors connected to conductor 134. The emitter of current emitter transistor 135 connects to resistor 136 which couples to the V− power supply conductor 133. The collector of transistor 135 couples to resistor 137 which couples to a power supply conductor which is ground for the embodiment of FIG. 2. The collector of constant current source transistor 125 couples to conductor 138 which in turn couples to the emitters of compare-latch mode selection transistors 130 and 131. The base of transistor 130 couples to conductor 139 which is the compare mode clock conductor which couples in the same manner to each of the converter stages. The base of transistor 131 couples to conductor 140 which is the latch mode clock conductor which couples to each of the individual comparator stages. The collector of transistor 130 couples to conductor 141 which in turn couples to the emitters of input transistors 126 and 127. The collector of transistor 131 couples to conductor 142 which in turn couples to the emitters of regenerative latching transistors 128 and 129. The collector of input transistor 126 couples to conductor 143 which couples to the collector of regenerative latching transistor 128, the base of regenerative latching transistor 129 and load resistor 144. The collector of input transistor 127 couples to conductor 145 which couples to the collector of regenerative latching transistor 129, the base of regenerative latching transistor 128 and to a first terminal of load resistor 146. A second terminal of load resistor 146 couples to a first emitter of output transistor 147. A second emitter of output transistor 147 couples to load resistor 148 which is part of comparator stage 104. The second terminal of load resistor 144 couples to a first emitter of output transistor 149. A second emitter of output transistor 149 couples to the load resistor of a similar comparator stage (not shown) within block 108. The base of output transistor 147 and the base of output transistor 149 are each coupled to an output reference voltage conductor 150 which also couples to the bases of similar output transistors for each of the individual comparator stages. This output reference voltage is generated by circuit 151 in which the emitter of transistor 152 is coupled via resistor 153 to ground and the base of transistor 152 couples to the collector of transistor 152 and to V+ power supply conductor 154 via resistor 155. The collector of transistor 152 couples to the base of transistor 156 whose collector couples to the V+ power supply conductor 154 and whose emitter couples to conductor 150 and to resistor 157 which in turn couples to ground.

Referring again to representative comparator stage 106, the collector of output transistor 147 couples to conductor 158 which is one of the multiplicity of conductors forming comparator output 20 previously mentioned in the discussion for FIG. 1. Conductor 158 also couples to a first terminal of an output resistor 159 whose second terminal couples to V+ power supply conductor 154. In a similar manner, the collector of output transistor 149 couples to conductor 160 which is another of the multiplicity of conductors forming the output of the comparator circuit. Conductor 160 also couples to a first terminal of resistor 161 whose second terminal couples to V+ power supply conductor 154.

Turning now to the operation of the comparator circuit of FIG. 2, as typified by the operation of representative comparator stage 106, it should first be noted that the comparator stage has two fundamental modes of operation, the compare mode and the latch mode. The compare mode is defined by a high level on the compare clock conductor 139 and a low level on the latch clock conductor 140. Conversely, the latch mode is defined by a low level on conductor 139 and a high level on conductor 140. The clock timing waveforms of FIG. 10 illustrate the relationship between these two clock signals. The compare-latch mode selecting transistor pair 130 and 131 determines whether comparator stage 106 is in the compare mode or the latch mode by supplying the current value defined by constant current transistor 125 to the emitters of either the "compare" emitter coupled transistors 126 and 127 or to the "latch" emitter-coupled transistor pair 128 and 129. Since the clock signals on conductors 139 and 140 are complements (see FIG. 10) only the compare transistors or the latch transistors will be active at any one time. In the compare mode, the analog input voltage present on conductor 102 which couples to the base of transistor 127 is compared to the reference voltage value present on conductor 118 which couples to the base of transistor 126. The coupling between the emitters of transistors 126 and 127 form a differential amplifier. When the applied analog input voltage on conductor 102 is less than the reference voltage value on conductor 118, the collector current of transistor 127 will be greater than the collector current of transistor 126 and as a result the voltage developed across resistor 146 will be larger than the voltage developed across resistor 144. Conversely, if the applied analog input voltage coupled to the base of transistor 127 is less than the reference voltage applied to the base of transistor 126, the voltage developed across resistor 144 will be greater than the voltage developed across resistor 146. Thus, in the compare mode the polarity of the differential voltage developed between the collector of transistor 126 and the collector of 127 indicates whether the analog input signal applied to comparator stage 106 is greater than or less than the reference voltage value applied to that same stage. A key feature in the speed of operation of each comparator stage and thus of the over-all comparator circuit is the use of latching transistors 128 and 129 when the compare-latch clock signals switch such that the level of the compare clock conductor 139 goes from high to low and the level of the latch clock conductor 140 goes from low to high (see FIG. 10). Transistor 130 switches to the nonconducting state and, simultaneously, transistor 131 switches to the conducting state such that latch transistors 128 and 129 are enabled. The regenerative cross-coupling formed by conductors 143 and 145 acts to re-enforce the polarity of any differential voltage established between the collectors of transistors 126 and 127 in the compare mode and thus store of "latch" the results of the comparison. Assume, for example, that the input voltage applied via conductor 102 is only slightly greater than the reference voltage value on conductor 118 so that at the end of the compare interval the collector of transistor 126 is only a few millivolts more positive than the collector of transistor 127. As the circuit enters the latch mode interval and transistors 128 and 129 begin to conduct, the slightly more positive voltage on conductor 143 will cause greater conduction in transistor 129 and less conduction in transistor 128 with the result that conductor 143 will become even more positive with respect to conductor 145. This regenerative effect proceeds rapidly until transistor 129 is saturated and transistor 128 is cut off. The speed inherent in a differential amplifier configuration which makes use of current switching together with the "snap" action of a latch circuit which uses regeneration to capture the results of a fast comparison are combined to provide a particularly useful high-speed comparator configuration.

High speed and a simple circuit configuration are further provided by the comparator circuit through the use of multiple emitter output transistor such as transistor 147 and transistor 149 shown in FIG. 2. Each of the individual comparator stages function in the manner previously described for representative stage 106 and in the latch interval, each stage will assume one of two possible states defined by the presence or absence of current in the load resistors such as representative resistors 144 and 146. If, during the compare interval, the applied analog input voltage on conductor 102 was greater than the reference voltage valve on conductor 118 during the latch mode, resistor 146 will conduct essentially all of the current flowing through constant current source transistor 125 and resistor 144 will conduct essentially no current. Conversely, if the applied analog input voltage on conductor 102 is less than the reference voltage value on conductor 118, resistor 146 will conduct essentially no current. Now consider the case where the applied analog input voltage has a value which is greater than the reference voltage value on conductor 116 but less than the reference voltage value on conductor 118. During the latch interval this value of applied analog input voltage will result in essentially no current in resistor 146 and no current in resistor 148. This means that no current can flow in either emitter of transistor 147 so that there is no current in the collector of transistor 147 and resistor 159 pulls output conductor 158 to a high level. Since all comparator stages to the left of comparator stage 106 see reference voltage values which are greater than the applied analog input voltage on conductor 102 they will all be latched into a conducting state which is the same as that described for stage 106 and as a result the multiple emitter output transistors corresponding to the stages will each have at least one conducting emitter so that all of the output conductors of comparator output 20 except for conductor 158 will be held in the low state. Thus, the multiple emitter output transistor structure shown in FIG. 2 provides a simple and high-speed method for producing an output signal on a single one of a multiplicity of output conductors which indicates the value of an applied analog input voltage with respect to a series of reference voltage values.

Figure 3:
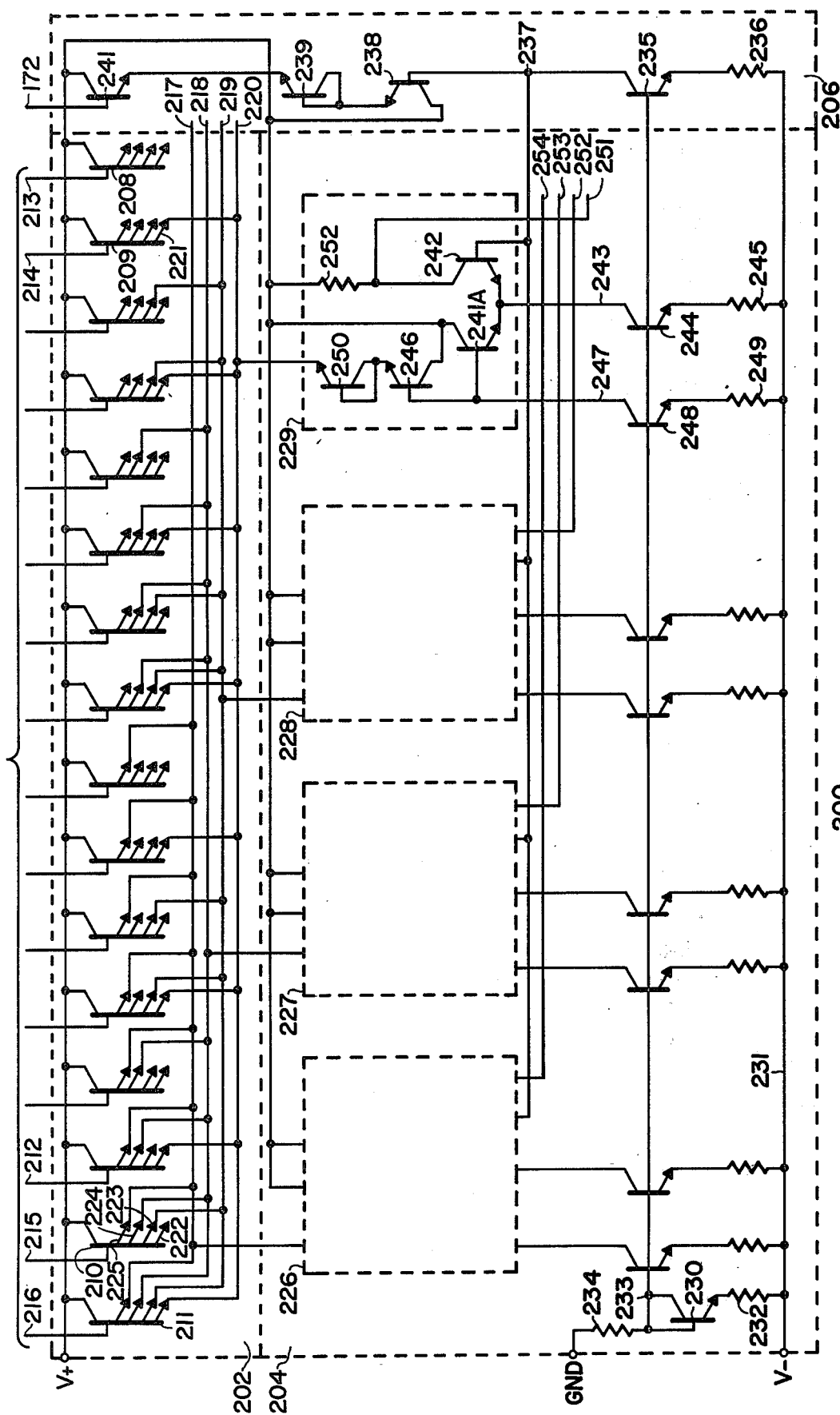
FIG. 3 is a circuit schematic diagram of an encoder which can be utilized to provide both encoders shown in FIG. 1.
Figure 4:
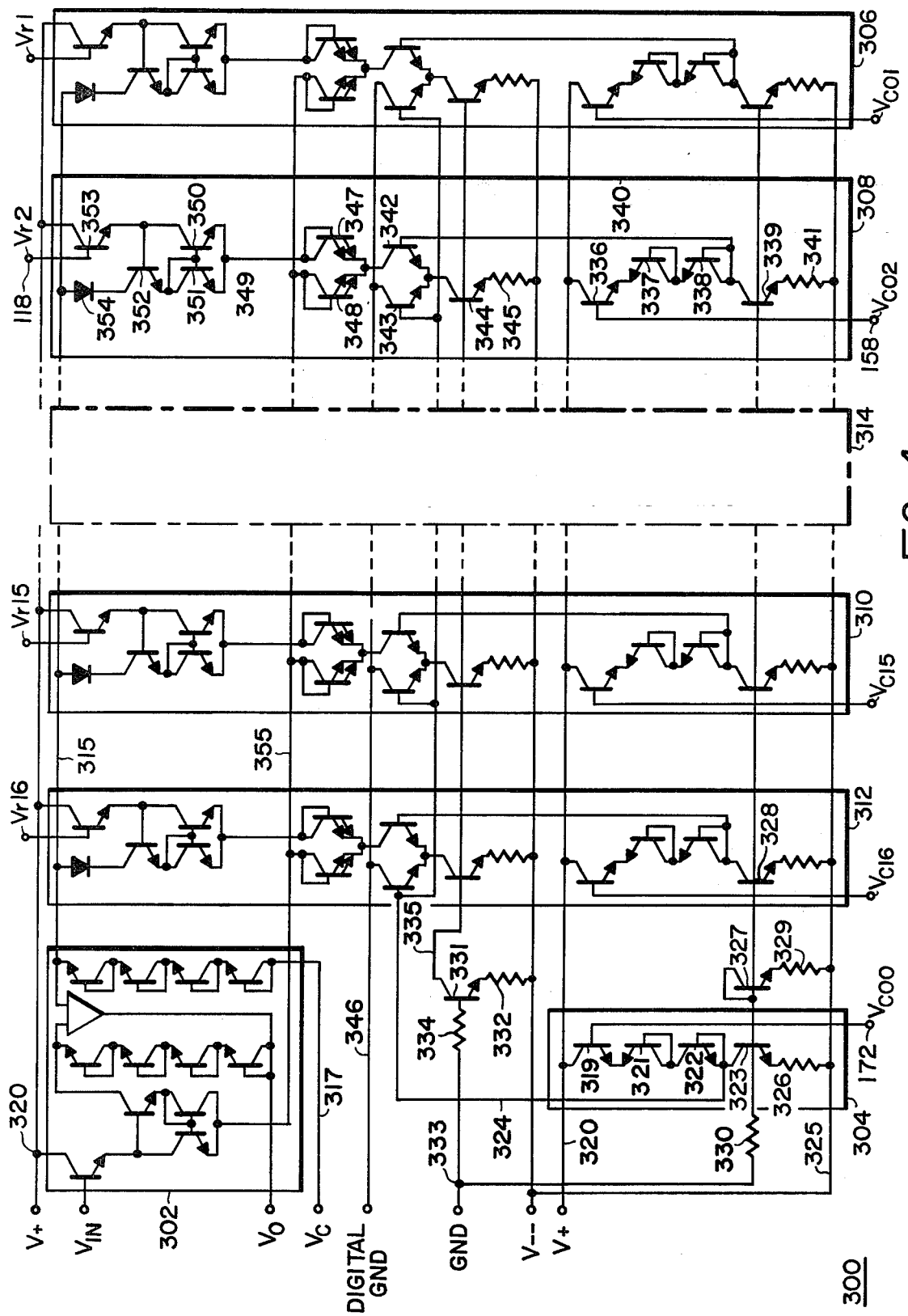
FIG. 4 is a circuit diagram of the voltage subtractor shown in FIG. 1.

The comparator circuit shown in FIG. 2 also includes a bias generating circuit 165 which is used for generating reference bias voltages used by the read-only memory encoder circuit (FIG. 3) and the voltage subtractor circuit (FIG. 4). Conductor 134 couples to the base of a constant current source transistor 166 whose emitter couples to the V— power supply conductor 133 via a current scanning resistor 167. The collector of constant current source transistor 166 couples to conductor 168 which in turn couples to the emitter of transistor 169. The base of transistor 169 couples to bias voltage conductor 150 and the collector of transistor 169 couples to resistors 170 and 171 and to output conductor 172 which is the reference bias voltage output. The required reference value on output 172 is obtained by making resistor 167 and transistor 166 identical to the constant current source networks of each comparator stage (as represented by transistor 125 and resistor 132). Similarly, the values of resistors 170 and 171 are chosen to be equal to the value of output resistors 159, resistor 161, etc. The result of this choice is that transistor 169 will conduct twice the current of an individual output transistor so that the voltage level established on reference bias voltage output conductor 172 is halfway between the high and low levels appearing on the individual conductors of comparator output 20.

FIG. 3 shows one particular embodiment of a read-only memory encoder circuit which can be used to implement the A/D converter of the present invention. Read-only memory encoder circuit 200 comprises a read-only memory input section 202, an output section 204 and a bias voltage generator 206. Read-only memory input section 202 consists of a plurality of multiple emitter transistors. The number of multiple emitter input transistors corresponds to the number of digital outputs produced by the comparator circuit of the A/D converter. Thus, for the particular embodiment of FIG. 3, read-only memory input section 202 comprises sixteen multiple emitter input transistors. Transistors 208, 209, 210 and 211 are representative of these transistors as shown in FIG. 3, the collectors of all of the multiple emitter input transistors are coupled to a common V+ power supply conductor 212. Each of the conductors forming the plurality of digital outputs from the comparator circuit of FIG. 2 couples to the base of one multiple emitter input transistor. Thus, a first comparator output couples to the base of multiple emitter transistor 208 via conductor 213, a second comparator output signal couples to the base of multiple emitter transistor 209 via conductor 214 and similar connections are made to the bases of each of the other multiple emitter input transistors such that a fifteenth comparator output signal is coupled to the base of transistor 210 via conductor 215 and a sixteenth comparator output signal couples to the base of multiple emitter transistor 211 via conductor 216. As previously discussed, the comparator circuit (FIG. 2) produces a plurality of digital output signals each of which represents a particular level of applied analog input signal. The particular arrangement of connections to the multiple emitters of the input transistors provide an encoding function by which a unique digital code is obtained for each comparator output signal and, thus, for each particular level of applied input signal. This arrangement of emitter connections is accomplished by providing a plurality of common conductors such as conductors 217, 218, 219 and 220. For the particular embodiment of read-only memory encoder 200, binary code is used. Thus, the comparator output signal on conductor 213, which indicates that the applied analog input signal is greater than a first reference voltage value, couples to the base of multiple emitter transistor 208, which has none of its emitters coupled to the common conductors 217, 218, 219 and 220 and thus defines a binary code 0000. A comparator output signal on conductor 214, which indicates that the level of applied analog input voltage is greater than a second reference voltage value, couples to the base of multiple emitter transistor 209 which has a first emitter 221 coupled to common conductor 220 thereby defining the binary code 0001. Similar emitter connections are used for the other multiple emitter transistors shown in read-only memory input circuit 202. Thus, a comparator output signal on conductor 215 indicates of an applied analog input signal level greater than a fifteenth reference voltage value couples to the base of transistor 210 which has a first emitter 222 which is not connected, a second emitter 223 which is coupled to conductor 219, third emitter 224 coupled to common conductor 218 and a fourth emitter 225 coupled to common conductor 217 thereby defining a binary code 1110. Similarly, a comparator output on conductor 216 indicative of an applied analog input signal level greater than a sixteenth reference voltage level, couples to the base of multiple emitter transistor 211 whose four emitters couple respectively to common conductors 217, 218, 219, and 220 thereby defining a binary code 1111. A multiple emitter encoding arrangement such as shown in FIG. 3 is advantageous because coded representations of the applied analog input level, other than the binary code shown, can be readily obtained by simply changing the emitter interconnection arrangement used. In a monolithic integrated circuit, device structures incorporating several emitter device regions within a common base region or other similar techniques commonly employed in integrated circuit read-only memories provide a simple way to obtain the multiple emitter structure shown and make it easy to change the interconnection pattern as required by a new code.

The coded representation provided by the signals on each of the conductors 217, 218, 219 and 220 are coupled respectively to output circuits 226, 227, 228 and 229 which provide the amplifications and level conversion required by the output latch circuit (FIG. 5 described below). Each of these output circuits operates using two constant current source transistors. The reference current for these constant current source transistors is provided by transistor 230 whose emitter couples to V− power supply conductor 231 via resistor 232 and whose base collector is coupled to conductor 233. Conductor 233 couples to the bases of the constant current source transistors of each output circuit and to a first terminal of resistor 234 whose second terminal couples to a power supply terminal (GND) which is ground for the particular embodiment of FIG. 3. Conductor 233 also couples to the base of constant current source transistor 235 which is part of reference voltage generating circuit 206.

In reference to voltage generating circuit 206, the emitter of constant current source transistor 235 couples to the V− power supply conductor 231 via resistor 236. The collector of constant current source transistor 235 couples to conductor 237 which is the reference bias voltage conductor coupling to each of the output circuits. Conductor 237 also couples to the base of transistor 238 whose collector couples to the V+ power supply conductor and whose emitter couples to the emitter base of transistor 239. The collector of transistor 239 couples to the emitter of transistor 241 whose collector couples to the V+ power supply and whose base couples to the reference bias voltage transmitted from the comparator circuit (FIG. 2) via conductor 172. As previously discussed, the reference bias voltage on conductor 172 defines a level midway between the low and high levels of the comparator output and reference voltage generating circuit 206 translates this voltage to the bias voltage present on conductor 237 thereby providing a trip point for high-speed current switching within each of the output circuits. The structure and operation of each of the output circuits is identical and will be described in terms of the operation of output circuit 229.

The heart of output circuit 229 is the differential amplifier formed by transistors 241A and 242. The emitters of transistors 241A and 242 are coupled by conductor 243 which also couples to the collector of first current source transistor 244. The base of first current source transistor 244 couples to current reference conductor 233 (previously described). The emitter of first current source transistor 244 couples to the V− power supply conductor 231 via current scanning resistor 245. Turning to the differential amplifier, the collector of transistor 241A couples to the V+ power supply conductor and to the collector of transistor 246. The base of transistor 246 couples to conductor 247 which also couples to the base of transistor 241A and to the collector of second current source transistor 248. The base of second current source transistor 248 couples to current source reference conductor 233. The emitter of second current source transistor 248 couples to the V− power supply via resistor 249. The collector of transistor 246 couples to the emitter and the base of transistor 250 whose collector forms the input of output circuit 229 and couples to common conductor 220. The base of transistor 242 couples to bias voltage conductor 237. The collector of transistor 242 which couples to conductor 251 which is the output of output circuit 229 and which also couples to the V+ power supply conductor via resistor 252.

The operation of memory encoder circuit 200 is understood by first looking at representive output circuit 229. When the voltage at the base of transistor 241A is less than the voltage at the base of transistor 242, the constant current value established by constant current source transistor 244 and resistor 245 will be conducted by transistor 242 and the resulting voltage drop across resistor 252 will establish a low level on output conductor 251. As previously discussed, the operation of the comparator circuit results in a high level on one of the comparator output conductors, for example, conductor 214. The encoding function of the emitter connections of each of the multiple emitter transistors steers such a high level to the inputs of the appropriate output driver circuits. Thus, a high level on conductor 214 results in a high level at emitter 221 of multiple emitter transistor 209 which couples via conductor 220 to the input of output circuit 229. This high level is level shifted by transistor 250 and transistor 246 to produce the appropriate change in voltage at the base of transistor 241A. Transistor 246 and transistor 250 operate in an emitter base reverse breakdown mode and resistor 249 is chosen such that a small constant current is conducted by constant current source transistor 248. This small current establishes a stable value of reverse breakdown voltage for transistor 246. As a result of the level shifted high level appearing at the base of transistor 241A, transistor 241A conducts the constant current value set by transistor 244 and transistor 242 becomes nonconducting so that the output level on conductor 251 changes from a low to a high level.

Circuit structures shown in FIG. 3 are particularly adapted to minimize the effects of temperature and process variations in the monolithic integrated circuit embodiment. The use of a current source, such as current source transistor 248, to establish a small stable current value to sustain the emitter base reverse breakdown voltage of the level shifter transistors tends to eliminate the effects of process variations. Also, the use of a common current source reference (conductor 233) for all output stages and in particular for the generation of the bias voltage on conductor 237 compensates for the effects of temperature and process variation. It also should be noted that transistor 250 can be eliminated in those applications where the additional level shifting it provides is not required.

The operation of each of the output circuits of read-only memory encoder 200 is the same as has been described for output circuit 229. Thus output circuit 228 responds to a high level on conductor 219 to produce a level shift at high level on output conductor 252, output circuit 227 responds to a high level on conductor 218 to produce a level shift at high level on output conductor 253 and output circuit 226 responds to a high level on conductor 217 to produce a level shifted high level on output conductor 254.

FIG. 4 shows one particular embodiment of a reference voltage switching and analog voltage subtraction circuit 300 which can be used in the present invention.

As previously discussed, the key to the high A/D conversion speeds obtained by the present invention is the time overlap or coincidence of the parallel conversion of the most significant bit group digital output and the least significant bit group digital output. This time overlap is obtained by using intermediate outputs obtained during the process of the most significant bit group conversion to determine the particular reference voltage value which must be subtracted from the applied analog input to obtain the analog difference signal required for the parallel conversion of the least significant bit group output. The reference voltage switching and subtraction of circuit 300 provides one way of accomplishing this requirement.

Circuit 300 comprises a basic subtractor module 302, a reference voltage generator 304 and a plurality of level shifting and reference voltage switching circuits. For the particular embodiment of FIG. 4, sixteen level shifting and reference voltage switching circuits are shown by representative circuits 306, 308, 310, and 312 with the remaining twelve circuits represented pictorially by block 314. Each of these switching modulates couples in common to conductor 315 which is the voltage reference input to subtractor module 302. The other inputs to subtractor module 302 are the analog voltage input $V_{IN}$ and the constant bias voltage input terminal (VC). The output of subtractor module 302 is VO terminal 318. Subtractor module 302 functions to subtract a particular reference voltage appearing on conductor 315 from the analog input voltage appearing on terminal 316 to produce an analog difference signal output which includes the constant bias voltage VC as an additive constant. The detailed circuit operation which allows subtractor module 302 to perform this function is given below in the detailed description of FIG. 8 and FIG. 9.

The particular reference voltage value which is applied to subtractor module 302 via conductor 315 is determined by the functioning of the switching modules as discussed above. The action of the latching comparator of FIG. 2 produces a high level on one of the plurality of comparator outputs. As shown in FIG. 4, each of the switching modules has an an input one of the comparator outputs and a corresponding voltage reference value. Thus, for example the comparator output VC02 couples to switching modules 308 via conductor 158 and corresponding voltage reference value $V_{r2}$ couples to switching modules 304 via conductor 118. Similarly, comparator output VC15 and corresponding voltage reference value $V_{r15}$ are coupled to switching module 310. This pattern is repeated for each of the modules.

Reference voltage generator 304 provides a reference voltage which provides the trip point for current switching in all of the switching modules. This voltage is derived from the VC00 voltage level which is applied to reference voltage 304 via conductor 172. As described above, VC00 defines a reference voltage level midway between the low (inactive) and high (active) output levels of the comparator outputs. Conductor 172 couples to the base of transistor 319 whose collector couples to a V+ power supply conductor 320 and whose emitter couples to the emitter of diode connected transistor 321 the base and collector of transistor 321 coupled to the collector of transistor 322 whose base and emitter are coupled to the collector of constant current source transistor 323 via conductor 324 which is the reference voltage output of reference voltage generator 304. The emitter of constant current source transistor 323 couples to V−− power supply conductor 325 via resistor 326. The base of constant current source transistor 323 couples to the base and collector of current reference transistor 327 via conductor 328 which is a first current source reference conductor for all of the switching modules. The emitter of current reference transistor 327 couples to V— — power supply conductor 325 via resistor 329. Current source reference conductor 328 also couples to a first terminal of resistor 330 whose second terminal couples to ground power supply conductor 333.

Transistor 331 whose emitter couples to V— — power supply conductor 325 via resistor 332 and whose base couples to ground power supply conductor 333 via resistor 334, couples as its collector to a second current source reference conductor 335 which is common to all of the switching modules.

The operation of the switching modules, each of which functions identically, will now be explained by considering the circuit operation of switching module 308. In switching module 308, the VC02 comparator output on conductor 158 couples to the base of transistor 336 whose collector couples to V+ power supply conductor 320. The emitter of transistor 336 couples to the emitter of transistor 337 whose base and collector couple to the emitter of transistor 338. The base and collector of transistor 338 are coupled to the collector of current source transistor 339 via conductor 340. The current source reference conductor 328 (common to all switching modules) couples to the base of current source transistor 339 whose emitter couples to V— — power supply conductor 325 via resistor 341. Transistors 336, 337, 338 and 339 function as a high-speed voltage level shifter for the VC02 comparator output on conductor 158 such that a voltage shifted replica of this output appears on conductor 340.

Conductor 340 couples to the base of transistor 342 whose emitter couples to the emitter of transistor 343 and to the collector of current source transistor 344 whose emitter couples to the V— — power supply conductor 325 via resistor 345. The base of transistor 343 couples to the voltage shifted comparator output reference voltage on conductor 324 which couples in common to all switching modules. Transistor 342 and 343 act as a differential current switch for the constant current value defined by constant current source transistor 344. When the voltage shifted comparator output level on conductor 340 is less than the voltage shifted reference voltage on conductor 324 (indicating that the VC02 comparator output is in the low or inactive state) the constant current defined by transistor 344 will be conducted by transistor 343 whose collector couples to conductor 346 which is the digital ground power supply conductor for all switching modules. In this state, the voltage reference value $V_{r2}$ on conductor 118 is decoupled from common conductor 315 and has no effect on the operation of subtractor module 302.

When the voltage shifted comparator output level on conductor 340 is in the high state (corresponding to comparator output VC02 on conductor 158 in the higher active state), the constant current defined by transistor 344 is conducted by transistor 342 whose collector couples to the commonly coupled emitter of transistors 347 and 348. The base and collector of transistor 347 are coupled to conductor 349 which couples to the emitters of transistors 350 and 351. The collector of transistor 350 couples to the base of transistor 352 and to the emitter of transistor 353 whose collector couples to V+ power supply conductor 320 and whose base couples to conductor 118 which is the $V_{r2}$ reference voltage input to switching module 308. The collector of transistor 352 couples to the cathode of diode 354 whose anode couples to common conductor 315. The base and collector of transistor 348 couples to conductor 355 which couples in common to all switching modules and to subtractor module 302.

Transistors 347, 348, 350, 351, 352 and 353 form a current splitting network such that when the VCO2 comparator output on conductor 158 is in its active (high) state, the constant current value established by transistor 344 is conducted via transistor 342 and divided between transistors 347 and 348 with the effect that voltage reference value $V_{r2}$ on conductor 118 is coupled to subtractor module 302 to form the required analog difference signal at the output of subtractor module 302. The manner in which this current switching is combined with the circuit operation of subtractor module 302 to obtain the required analog difference signal is explained in the detailed circuit description of the basic subtractor module (FIG. 8 and FIG. 9) given below.

Figure 8:
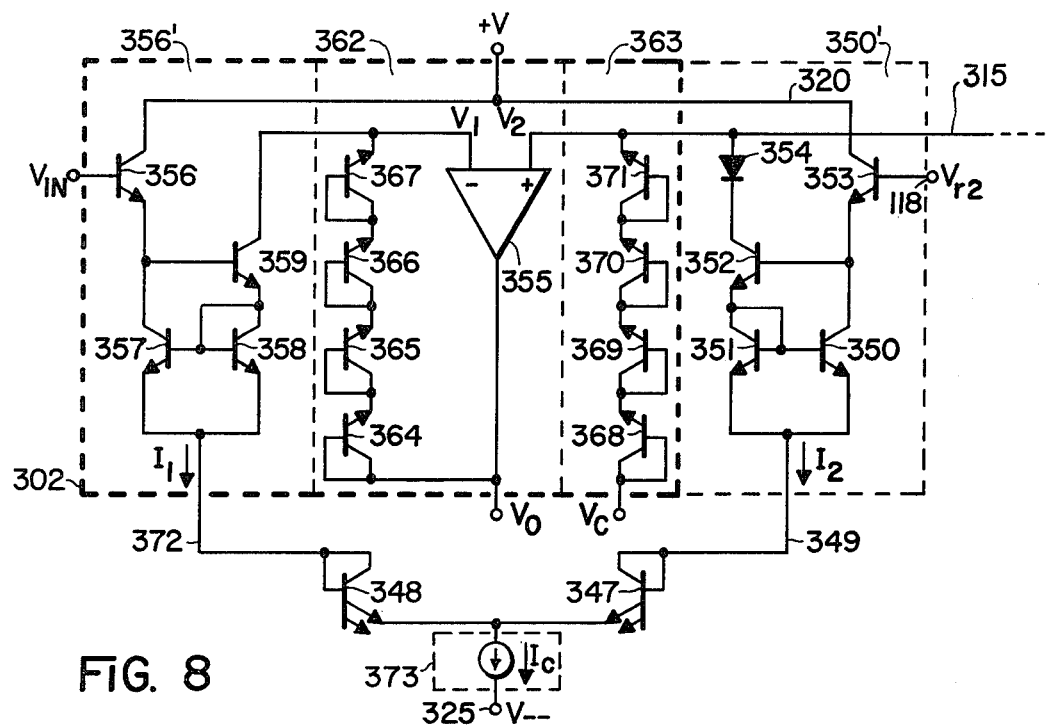
FIG. 8 is a circuit diagram of part of the subtractor circuitry of FIG. 4 and is useful in describing the operation of the subtractor circuit of FIG. 4.

FIG. 8 shows subtractor module 302 together with portions of the current splitting and current switching circuits of FIG. 4 arranged to facilitate explanation of the particular and unique subtraction circuit used in the present invention. As shown in FIG. 8, the structure of the subtractor is a symmetrical arrangement of circuitry around an operational amplifier. As previously discussed, reference voltage value $V_{r2}$ is coupled via conductor 118 to the current splitting network formed by transistors 350, 351, 352 and 353 and diode 354. The anode of diode 354 couples via conductor 315 to the (+) input of operational amplifier 355. In a symmetrical fashion the analog input voltage couples to a current splitting network formed by transistors 356, 357, 358 and 359 with the collector of transistor 359 coupling to the negative (−) input of operational amplifier 355. The output of operational amplifier 355 couples to the $V_0$ output of the subtractor. A first logarithmic impedance means 362 couples from the negative input of the operational amplifier the $V_0$ output to form a feedback connection between the operational amplifier output and input. A second logarithmic impedance means 363 couples from the constant bias voltage terminal ($V_C$) to conductor 315. For the particular embodiment of FIG. 8, first logarithmic impedance means 362 comprises the four diode connected transistors 364, 365, 366 and 367 coupled in series and in similar fashion, second logarithmic impedance means 363 comprises the four diode coupled transistors 368, 369, 370 and 371 again coupled in series. As shown in FIG. 8 the output of second current splitting circuit 350' couples to conductor 349 which couples to the base and collector of transistor 347. The current in conductor 349 is designated $I_2$. Similarly, the output of first current splitting circuit 356' couples to conductor 372 which couples to the base and collector of transistor 348. The current flowing in conductor 372 is designated $I_1$. The emitters of transistors 347 and 348 are coupled in common and coupled to current source 373 which in turn couples to V— — power supply conductor 325. It should be noted that current source 373 is an abbreviated symbolic representation of the current source and current switching circuitry previously described in FIG. 4 which is shown in FIG. 8 in abbreviated form to simplify the description of operation. Also, for further convenience in this discussion of operation, the current flowing in current source 373 is designated as $I_C$. The operational amplifier input voltage is designated $V_1$ and the operational amplifier input voltage on conductor 315 is designated $V_2$.

Turning now to the basic operation of the subtractor circuit shown in FIG. 8, consider first the differential amplifier formed by transistor 356-348 and transistor 353-347. The collector current of transistor 359 and the emitter current of transistor 356 are both equal to $I_1/2$ because of the current mirror formed by transistors 356 and 358. While the collector current of transistor 352 and the emitter current of transistor 353 are similarly $I_2/2$. The sum of the currents $I_1$ and $I_2$ must equal the source current $I_C$. It can be shown that when all devices are in their linear region, $$V_{in} - V_{r2} = 4\left(\frac{kT}{q}\right) \ln\left[\frac{I_1}{I_2}\right] \tag{1}$$

Since operational amplifier 355 draws a negligible input current the current through logarithmic impedance means 363 must be $I_2/2$ and thus $$V_2 = V_C - 4\left(\frac{kT}{q}\right) \ln\left[\frac{(I_2)/2}{I_S}\right] \tag{2}$$

where $I_S$ is the base-emitter reverse saturation current and $V_C$ is the constant bias voltage.

Similarly, summing voltages around the loop containing impedance means 362 gives $$V_1 = V_0 - 4\frac{kT}{q} \ln\left[\frac{I_1/2}{I_S}\right] \tag{3}$$

For a high gain operational amplifier in a unity gain configuration, the inputs $V_1$ and $V_2$ are virtually identical so that $$V_0 = V_C + 4\frac{kT}{q} \ln\left[\frac{I_1}{I_2}\right] \tag{4}$$

But this last term, from equation (1), gives $$V_0 = V_C + (V_{IN} - V_{r2}) \tag{5}$$

The subtractor output $V_0$ is thus the input voltage minus the next smaller reference voltage value offset by a constant bias voltage.

Examination of the above equations relating to the operation of the basic subtractor circuit of the present invention shows that the required analog difference signal output is obtained because the ratio of the currents flowing in the logarithmic impedance means 362 and 363 ($I_1/2$ divided by $I_2/2$) is the same as the ratio of the currents flowing in transistors 348 and 347 ($I_1$ divided by $I_2$). Thus, the function of the current splitting networks 356' and 350' is to prevent any current conducted by the $V_{IN}$ conductor or the $V_{r2}$ conductor 118 from distorting inputs of operational amplifier 355. Thus, it is clear that other circuit arrangements which preserve the equality of the current ratio can also be used.

Figure 9:
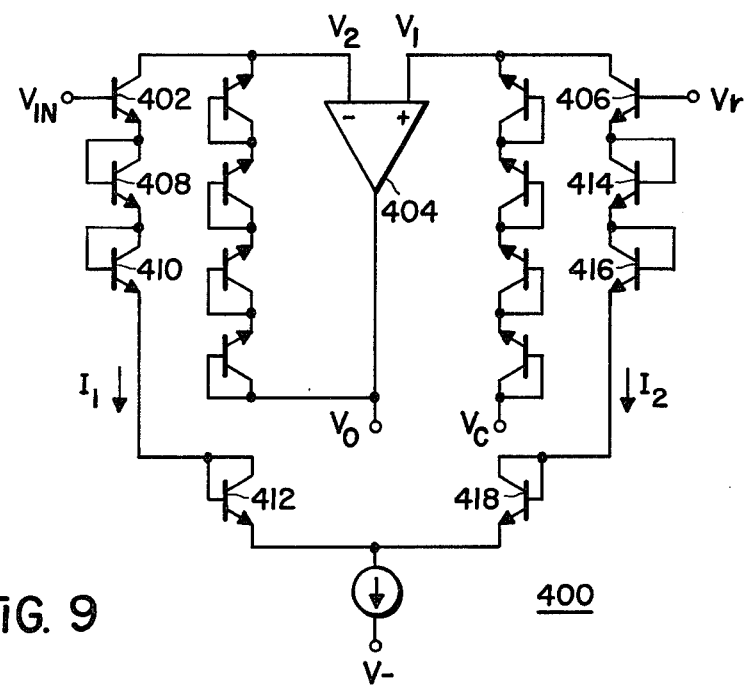
FIG. 9 is a circuit diagram of alternative circuitry which can be utilized in the subtractor of FIG. 4.

FIG. 9 shows a subtractor circuit 400 which is one such embodiment. In FIG. 9 the current splitting currents used in FIG. 8 have been replaced by simple emitter follower structures. Thus the $V_{IN}$ input couples to the base of a transistor 402 whose collector couples to one input of an operational amplifier 404 and the $V_r$ input couples to the base of transistor 406 whose collector couples to the other input of operational amplifier 404. The emitter of transistor 402 couples via diode connected transistors 408 and 410 to the collector and base of transistor 412 which is analogous to transistor 348 (FIG. 8). Similarly the emitter of transistor 406 couples via diode connected transistors 414 and 416 to the collector and the base of transistor 418 which is analogous to transistor 347 (FIG. 8). Because the current ratio is maintained, the equations listed above for FIG. 8 apply to the operation of this circuit. This circuit requires that the current gain of transistors 402 and 406 be high enough to ensure that the base current conducted via the $V_{IN}$ and $V_r$ inputs is negligible with respect to currents $I_1$ and $I_2$.

Figure 6:
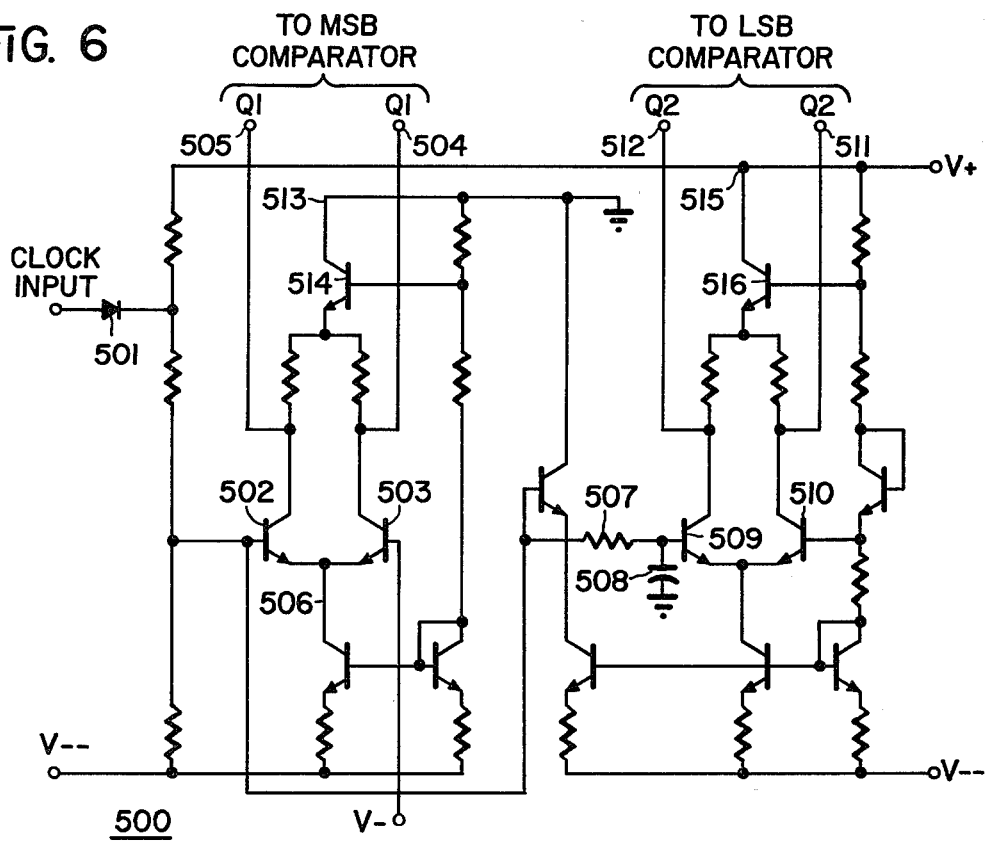
FIG. 6 is a circuit diagram of the compare-latch command generator of FIG. 1.

FIG. 6 shows a compare-latch compound generator circuit 500 which can be used to implement the present invention. This circuit uses high-speed current switching to provide the high frequency compare and latch mode clock signals required by the comparator to accomplish the high-speed A/D conversion objectives of the present invention. As shown in the Figure, a clock input is level shifted by a zener diode 501 and coupled to a first differential amplifier formed by transistors 502 and 503. The collector of transistor 503 couples to Q1 output conductor 504 which is the compare mode clock for the most significant bit (MSB) comparator. Similarly, the collector of transistor 502 couples to the $\overline{Q1}$ output conductor 505 which is the latch mode clock for the most significant bit (MSB) comparator. The level shifted clock input also couples via conductor 506 to resistor 507 and capacitor 508. Resistor 507 and capacitor 508 form a delay line which delays the applied clock input prior to its being coupled to the differential amplifier formed by transistors 509 and 510. The collector of transistor 510 couples to Q2 clock conductor 511 which is the compare mode clock for the least significant bit comparator. Similarly, the collector of transistor 509 couples to the $\overline{Q2}$ clock conductor 512 which is the latch mode clock for the least significant bit comparator. It should also be noted in FIG. 6 that the collector load resistors of transistors 502 and 503 couple to ground power supply conductor 513 via transistor 514 while the collector load resistors of transistor 509 and 510 couple to V+ power supply conductor 515 via transistor 516. These differences in collector supply voltage provide compare mode and latch mode clock signals appropriate for each comparator. The time relationship of the compare mode and latch mode outputs of compare-latch command generator circit 500 are shown in the timing diagram of FIG. 10.

As previously discussed, the A/D converter of the present invention achieves high speed operation by overlapping the parallel conversion used to produce the most significant bit group digital output and the least significant bit group digital output. FIG. 10 shows the timing relationship of this overlapping. FIG. 10 shows three successive conversion periods designated $T_1$, $T_2$ and $T_3$. Each of these conversion intervals is subdivided into four small intervals designated $t_1$, $t_2$, $t_3$ and $t_4$. Under the control of the 1 clock, the applied analog input signal is compared by the MSB comparator during the $t_1$ interval of each conversion period and the results of this comparison are latched in the comparator during the subsequent time period defined by $t_2$, $t_3$ and $t_4$. Similarly under control of the 2 clock, the analog difference signal generated by the voltage subtractor is compared by the MSB comparator during time interval $t_3$ of each conversion period and the results of the comparison latched in the comparator for the next three time intervals. Thus as shown in FIG. 10, both the MSB and LSB comparisons are complete at the end of the $t_3$ time interval and after the encoding of the MSB and LSB ROM encoders, the complete digital representation of the applied analog input quantity will be available. In order that all bits of the digital representation appear simultaneously, the A/D converter circuit of the present invention includes an output latch circuit 600 and an output read/latch command generator circuit 700.

Referring to FIG. 5, output latch circuit 600 comprises four identical latch circuits 601, 602, 603 and 604. The structure and operation of each latch circuit will be explained in terms of representative circuit 601 which comprises NAND gate 605, 606 and 607. NAND gate 606 and 607 are cross coupled to form a latch. Conductor 608 couples the R clock signal generated by output read-latch command generator circuit 700 to an input of NAND gate 607. This signal forces the latch formed by NAND gate 606 and 607 to the "reset" state during the time interval $t_4$ shown in FIG. 10. Conductor 609 couples the $\overline{R}$ clock signal generated by output read/latch command generator circuit 700 to an input of NAND gate 605. Conductor 609 is high during the time interval $t_4$ shown in FIG. 10 and thus enables NAND gate 605 during that time such that the digital data coupled to a second input of NAND gate 605 via conductor 610 is inverted and applied to the "set" input of the latch formed by NAND gate 606 and 607. At the end of time interval $t_4$, the R clock signal on conductor 608 returns to a high level such that the latch circuit formed by NAND gates 606 and 607 is no longer held in the reset state and will, accordingly, latch into the state defined by the logic level at the output of NAND gate 605 thereby producing the required digital output on conductor 611 which couples to the output of NAND gate 606. In a similar fashion the ROM encoder output applied to latch circuit 602 via conductor 612 is latched to produce a digital output on conductor 613, the ROM encoder output applied to latch circuit 603 via conductor 614 is latched to produce a digital output on encoder 615 and the ROM encoder output applied to latch circuit 604 via conductor 616 is latched to produce a digital output on conductor 617.

FIG. 7 shows output read-latch command generator circuit 700 which comprises cross coupled NOR gates 701 and 702, NAND gate 703 and inverter 704. The inputs to circuit 700 are clock signals from the compare-latch command generator circuit 500 shown in FIG. 6. Compare mode clock 1 couples via conductor 504 to an input of NOR gate 701 and compare mode clock 2 couples to an input of NOR gate 702 via conductor 511. These signals alternately set and reset the latch formed by NOR gate 701 and 702 to produce a signal at the output of NOR gate 701 which is low during time interval $t_1$ and $t_2$ and high during time interval $t_3$ and $t_4$ (see FIG. 10). This outpt of NOR gate 701 couples to an input of NAND gate 703 via conductor 705. Latch mode clock 2 (FIG. 6) couples to a second input of NAND gate 703 via conductor 512. As shown in FIG. 10, latch mode clock 2 is low during time interval $t_3$ and high during time intervals $t_1$, $t_2$ and $t_4$. Thus the coincidence of high levels at the input of NAND gate 703 produces the output read-latch command R at the output of NAND gate 703 which couples to conductor 609. This signal is coupled to the input of inverter 704 whose output couples to conductor 609 which is the inverted output read-latch command R.

What is claimed is:

1. A high-speed subtractor circuit comprising:
   amplifier means responsive to an analog input signal and to a first reference voltage for producing an output voltage so that it is proportional to the difference between said analog input signal and said reference voltage;
   first means responsive to a control signal for controllably electrically coupling said first reference voltage to a first input of said amplifier means;
   second means responsive to said analog input signal for electrically coupling said analog input signal to a second input of said amplifier means;
   feedback means coupled between the output of said amplifier means and said second input of said amplifier means for effecting said producing of said proportionality of said output voltage;
   third means coupled between a constant reference voltage and said first reference voltage for effecting said producing of said proportionality of said output voltage.

2. A high-speed voltage subtractor, comprising: an operational amplifier having a first and a second input and an output; an analog input coupled to the first input of the operational amplifier; a voltage reference input coupled to the second input of the operational amplifier; a current source for providing a constant current; a first means responsive to the analog input and coupled to the current source; a second means coupled to the voltage reference input and coupled to the current source, current flow through the second means being controllable by an input to the voltage reference input; a first logarithmic impedance coupled between the output and the first input of the operational amplifier; and a second logarithmic impedance coupled between a bias voltage and the second input of the operational amplifier.

3. The high-speed voltage subtractor of claim 2 wherein the first means conducts a portion of the current provided by the current source and the second means conducts another portion of the current provided by the current source so that all the current provided by the current source is divided between the first and second means, and the amount of current conducted by the first means is controlled by an input at the analog input and the amount of current conducted by the second means is controlled by an input at the voltage reference input.

4. The high-speed voltage subtractor of claim 2 wherein the first and second logarithmic impedances are each a series of diodes.

* * * * *